(12) United States Patent
Fuller et al.

(10) Patent No.: US 12,315,749 B2
(45) Date of Patent: May 27, 2025

(54) METHODS OF INSTALLING A PURGE FLUID CONDITIONING ELEMENT INTO A SEMICONDUCTOR SUBSTRATE CARRYING CONTAINER

(71) Applicant: ENTEGRIS, INC., Billerica, MA (US)

(72) Inventors: Matthew A. Fuller, Colorado Springs, CO (US); Shawn D. Eggum, Lonsdale, MN (US); Mark V. Smith, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/827,300

(22) Filed: May 27, 2022

(65) Prior Publication Data
US 2023/0197489 A1 Jun. 22, 2023

Related U.S. Application Data

(60) Provisional application No. 63/291,149, filed on Dec. 17, 2021.

(51) Int. Cl.
*H01L 21/673* (2006.01)
*H01L 21/67* (2006.01)

(52) U.S. Cl.
CPC .. *H01L 21/67386* (2013.01); *H01L 21/67017* (2013.01); *H01L 21/67389* (2013.01)

(58) Field of Classification Search
CPC ......... H01L 21/67389; H01L 21/67017; H01L 21/67386
USPC .......................... 206/722, 723, 832, 710–712
See application file for complete search history.

(56) References Cited

U.S. PATENT DOCUMENTS

| | | | |
|---|---|---|---|
| 5,879,458 A * | 3/1999 | Roberson, Jr. .... | H01L 21/67769 414/217 |
| 6,042,651 A * | 3/2000 | Roberson, Jr. .... | H01L 21/67017 414/217 |
| 7,866,480 B2 | 1/2011 | Burns et al. | |
| 8,146,623 B2 * | 4/2012 | Tieben .............. | H01L 21/67393 414/940 |
| 8,453,842 B2 | 6/2013 | Inoue | |
| 8,783,463 B2 * | 7/2014 | Watson ............. | H01L 21/67393 206/454 |
| 9,054,144 B2 * | 6/2015 | Burns ............... | H01L 21/67376 |

(Continued)

FOREIGN PATENT DOCUMENTS

| | | |
|---|---|---|
| JP | 2003168728 A | 6/2003 |
| JP | 2010270823 A | 12/2010 |

(Continued)

*Primary Examiner* — Chun Hoi Cheung

(57) ABSTRACT

Methods of installing a purge fluid conditioning element into an interior space of a semiconductor substrate carrying container are described. The purge fluid conditioning element is installed from outside the semiconductor substrate carrying container through a port formed in one of the walls of the container, where the port is sized to permit the purge fluid conditioning element to be inserted into the interior space of the container by installing the purge fluid conditioning element through the port. The wall may be a bottom wall of the container or another wall of the container. The described methods eliminate the need to install the purge fluid conditioning element from the inside of the container which can cause human contamination of the interior environment of the container.

19 Claims, 10 Drawing Sheets

(56) References Cited

U.S. PATENT DOCUMENTS

| | | | |
|---|---|---|---|
| 10,032,660 B2* | 7/2018 | Burns | H01L 21/67376 |
| 10,101,047 B2* | 10/2018 | Lo | F24F 7/04 |
| 10,347,517 B2* | 7/2019 | Smith | H01L 21/67051 |
| 10,672,637 B2* | 6/2020 | Glavan | H01L 21/67376 |
| 11,448,330 B2 | 9/2022 | Matsutori et al. | |
| 2004/0182472 A1* | 9/2004 | Aggarwal | H01L 21/67393 |
| | | | 141/98 |
| 2011/0114534 A1* | 5/2011 | Watson | H01L 21/67393 |
| | | | 206/710 |
| 2014/0194050 A1* | 7/2014 | Lo | F24F 7/04 |
| | | | 454/306 |
| 2015/0041360 A1 | 2/2015 | Watson et al. | |
| 2017/0213752 A1 | 7/2017 | Ogawa et al. | |
| 2018/0247849 A1* | 8/2018 | Glavan | H01L 21/67376 |
| 2019/0393062 A1 | 12/2019 | Ogawa et al. | |
| 2020/0058532 A1 | 2/2020 | Yang et al. | |
| 2020/0075374 A1 | 3/2020 | Smith et al. | |
| 2021/0323756 A1 | 10/2021 | Chiu et al. | |
| 2022/0208582 A1* | 6/2022 | Fuller | H01L 21/67389 |
| 2022/0384227 A1* | 12/2022 | Fuller | H01L 21/67393 |

FOREIGN PATENT DOCUMENTS

| | | |
|---|---|---|
| JP | 2012114133 A | 6/2012 |
| JP | 2016015421 A | 1/2016 |
| JP | 2017017264 A | 1/2017 |
| KR | 20110110063 A | 10/2011 |
| KR | 20140088406 A | 7/2014 |
| KR | 20190048205 A | 5/2019 |
| KR | 20200121795 A | 10/2020 |
| WO | 2016135952 A1 | 9/2016 |
| WO | 2018179964 A1 | 10/2018 |
| WO | 2021178703 A1 | 9/2021 |

* cited by examiner

METHODS OF INSTALLING A PURGE FLUID CONDITIONING ELEMENT INTO A SEMICONDUCTOR SUBSTRATE CARRYING CONTAINER

FIELD

This technical disclosure relates to semiconductor substrate carrying containers, for example those used in semiconductor manufacturing, and installing purge fluid conditioning elements into the semiconductor substrate carrying containers.

BACKGROUND

Substrate carrying containers are used to transport substrates during semiconductor manufacturing. Substrate carrying containers typically include a shell which provides an internal space for holding substrates, and a plate that is used to interface with various conveyors and other devices, for example so that the container can be moved around the processing facility.

SUMMARY

Methods of installing a purge fluid conditioning element into an interior space of a semiconductor substrate carrying container are described. The purge fluid conditioning element is installed from outside the semiconductor substrate carrying container through a port formed in one of the walls of the container. The port may be referred to as a purge port, and the port is sized to permit the purge fluid conditioning element to be inserted into the interior space of the container by installing the purge fluid conditioning element through the port. The wall may be any wall of the container. In one embodiment, the wall may be a bottom wall of the container. Installing the purge fluid conditioning element as described herein eliminates the need to install the purge fluid conditioning element from the inside of the container which is required with conventional semiconductor substrate carrying containers which can cause human contamination of the interior environment of the container.

The semiconductor substrate carrying container can be any type of container used to hold and transport semiconductor substrates during semiconductor manufacturing. An example of a semiconductor substrate carrying container includes, but is not limited to, a front opening unified pod (FOUP).

The semiconductor substrates held within the container can be any substrates used in semiconductor manufacturing. Examples of the semiconductor substrates that can be located in the container described herein can include, but are not limited to, wafers and panels (such as flat panels), and combinations thereof.

In an embodiment, a method described herein can include installing the purge fluid conditioning element into the interior space of the semiconductor substrate carrying container that includes a plurality of walls that define the interior space and that has an opening that is sized to permit a semiconductor substrate to be inserted into and removed from the interior space. Installing the purge fluid conditioning element includes installing the purge fluid conditioning element from outside the semiconductor substrate carrying container and through the port that is formed in one of the walls.

The purge fluid conditioning element can be any type of element that is insertable through the port and into the interior space for use in conditioning the environment in the interior space of the container. Examples of purge fluid conditioning elements include, but are not limited to, a diffuser, a getter, a filter, elements that combine one or more of these functions, and others.

In another embodiment, a method described herein can include installing the purge fluid conditioning element into the interior space of the semiconductor substrate carrying container by inserting the purge fluid conditioning element through the port formed in a wall of the shell, such as a bottom wall, a top wall, or a side wall of a shell, of the semiconductor substrate carrying container from outside the semiconductor substrate carrying container.

In still another embodiment, a method described herein can include installing the purge fluid conditioning element into the interior space of the semiconductor substrate carrying container while at least one semiconductor substrate is present in the interior space. This embodiment is permitted by the ability to install the purge fluid conditioning element through the port in a wall of the container from outside the container. However, in another embodiment, the purge fluid conditioning element can be installed into the interior space of the semiconductor substrate carrying container without any semiconductor substrates being present in the interior space.

DRAWINGS

DETAILED DESCRIPTION

Figure 1:
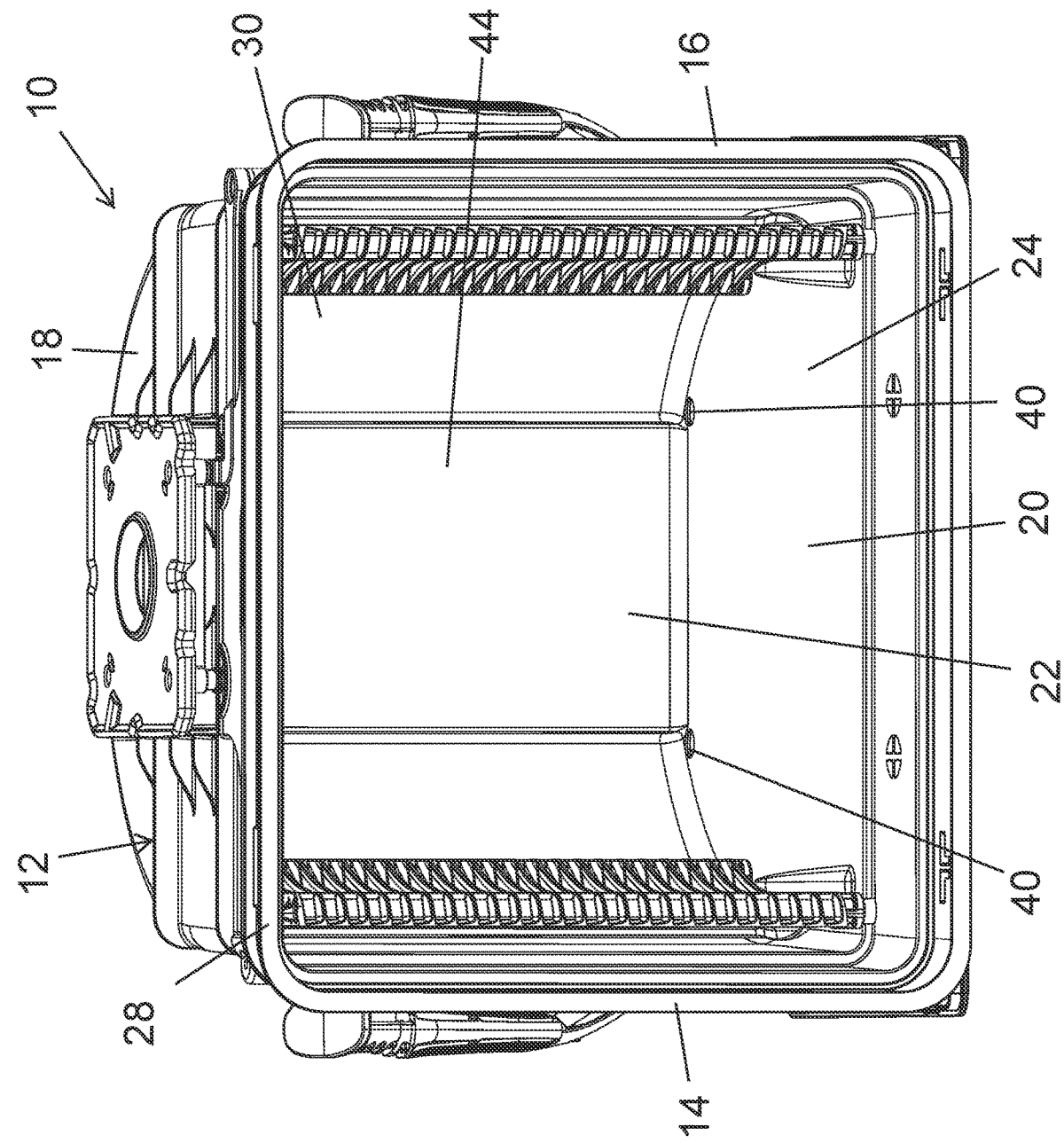
FIG. 1 is a front perspective view of a semiconductor substrate carrying container according to a first embodiment.
Figure 2:
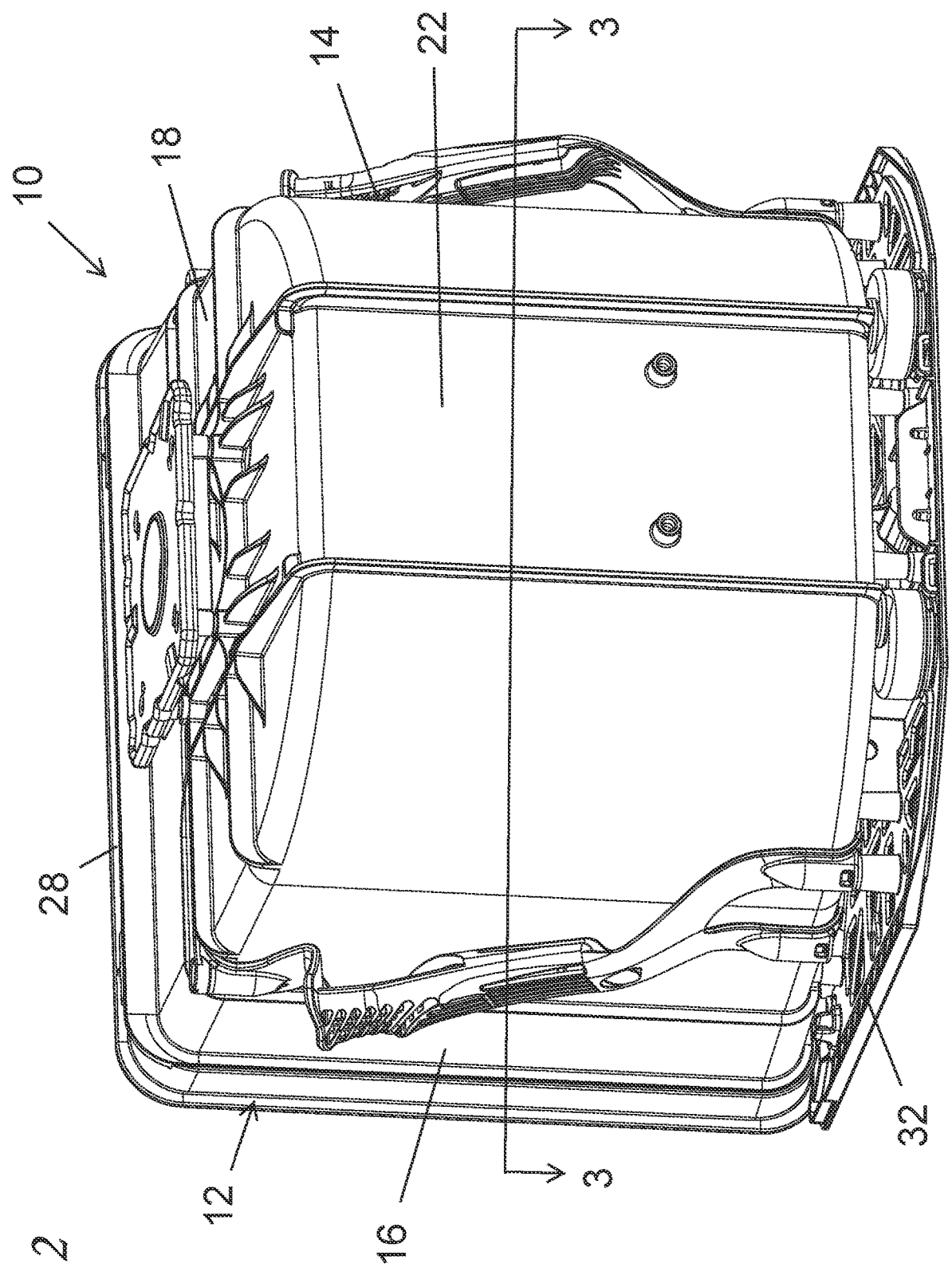
FIG. 2 is a rear perspective view of the semiconductor substrate carrying container of FIG. 1.

With reference to FIGS. 1-2, an example of a semiconductor substrate carrying container 10 is depicted. In one embodiment, the container 10 may be referred to as a FOUP. The container 10 includes a container shell 12 having a plurality of walls including a first side wall 14, a second side wall 16 opposite the first side wall 14, a top wall 18, a bottom wall 20 (not visible in FIG. 2) opposite the top wall 18, and a rear wall 22. The walls define an interior space 24 (not visible in FIG. 2) that is sized to be able to receive a plurality of semiconductor substrates 26 therein (one semiconductor substrate 26 is shown in broken lines in FIG. 3) with the substrates 26 in a vertically stacked arrangement where the substrates 26 are vertically spaced from one another and each substrate 26 is oriented horizontally substantially parallel to the top wall 18 and the bottom wall 20. In one embodiment, the container 10 can be configured to receive and hold twenty-four of the substrates 26, although the container 10 can be configured to hold a larger or smaller number of the substrates 26. The substrates 26 can be held in the container 10 in any suitable manner. Techniques for holding substrates in semiconductor substrate carrying containers such as FOUPs is well known in the art.

With continued reference to FIGS. 1 and 2, the container 10 further includes a front 28 having a front opening 30 (visible in FIG. 1) through which each one of the semiconductor substrates 26 is able to be removed from and inserted into the interior space 24. In addition, a machine interface plate 32 (best seen in FIGS. 2 and 6) is secured to the bottom wall 20 of the shell 12. The plate 32 may be considered part of the bottom wall 20 or separate from the bottom wall 20.

Figure 3:
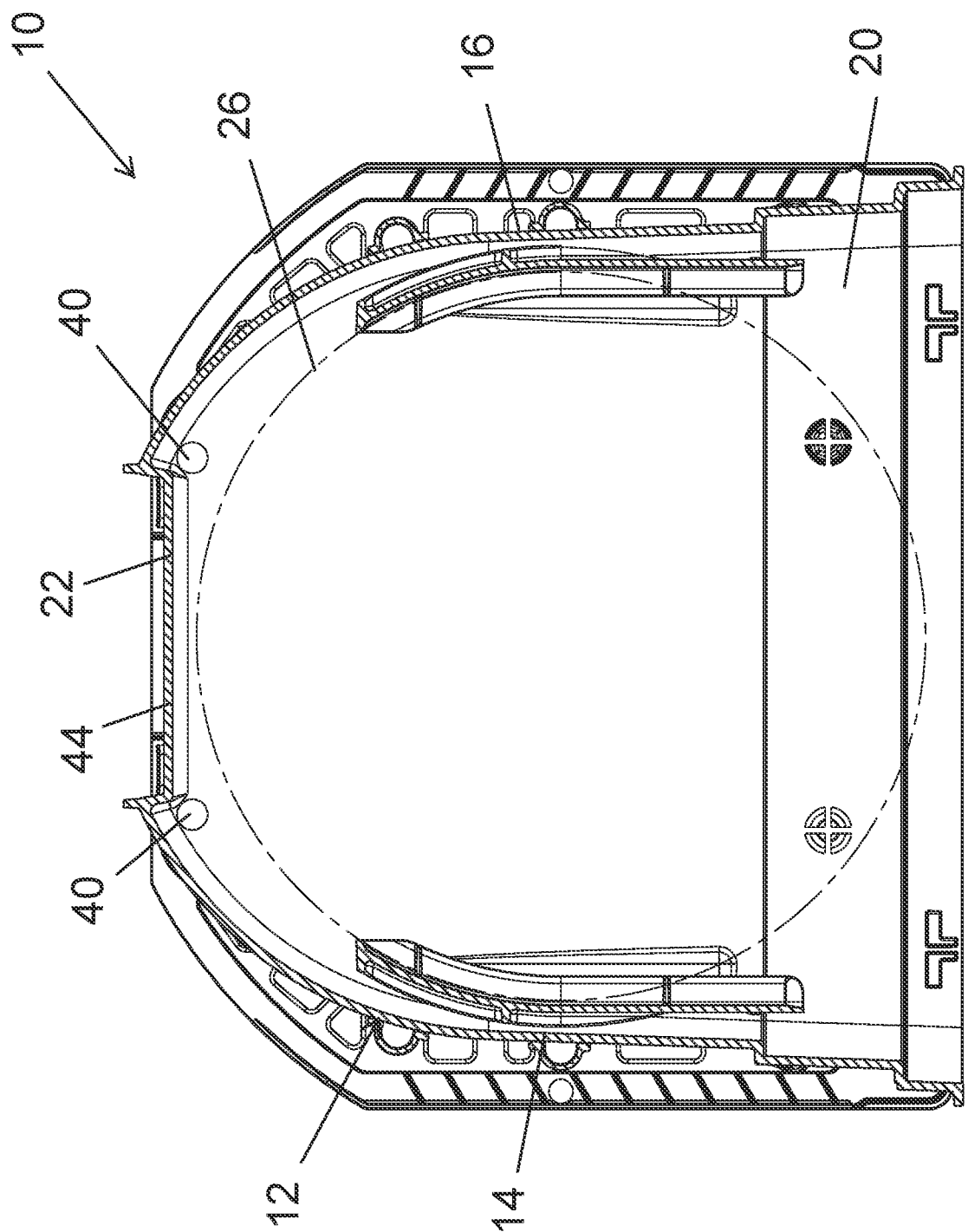
FIG. 3 is a top cross-sectional view of the semiconductor substrate carrying container taken along line 3-3 in FIG. 2.

The semiconductor substrates 26 can be any substrates used in semiconductor manufacturing. Examples of the semiconductor substrates 26 that can be located in the containers 10 described herein can include, but are not limited to, wafers and panels (such as flat panels), and combinations thereof. FIG. 3 depicts the substrate 26 as being a wafer.

The substrate container 10 can be formed from one or more polymer materials including, but not limited to, injection-moldable polymer materials. The polymer material(s) can include, but are not limited to, one or more polyolefins, one or more polycarbonate, one or more thermoplastic polymers and the like. In an embodiment, some or all of the substrate container 10 can be injection molded. The one or more polymer materials can form a matrix including carbon fill. In an embodiment, the one or more polymer materials can be selected to minimize particle shedding during handling and use of the substrate container 10.

Referring to FIGS. 1 and 3, at least one purge port 40 (or port 40) extends through the bottom wall 20 and opens entirely into the interior space 24. In the illustrated example, the container 10 is depicted as including two of the purge ports 40. However, the container 10 can include a single one of the purge ports 40 or more than two of the purge ports 40. If the plate 32 is present, openings 46 (visible in FIG. 6) are formed in the plate 32 that are aligned with the purge ports 40 to permit access to the purge ports 40 via the openings 46. The purge ports 40 are depicted as being circular in shape. However, the purge ports 40 can have any shape including, but not limited to, rectangular, square, triangular, and other. In another embodiment, one or more of the purge ports 40 may be formed through the top wall 18, for example at a location directly opposite the illustrated locations of the purge ports 40 in the bottom wall 20. Purge port(s) formed in the top wall 18 may have the same shape as the purge port(s) 40 formed in the bottom wall 20, or the purge port(s) formed in the top wall 18 may have a shape that is different than the shape of the purge port(s) formed in the bottom wall 20.

In a conventional semiconductor substrate carrying container, purge fluid conditioning elements are manually installed and mounted into conventional purge ports from inside the interior space of the container. In other words, a person installing the purge fluid conditioning elements reaches inside the interior space of the container and installs the elements into the purge ports. However, this can cause human contamination of the interior environment of the container.

In contrast, the purge ports 40 of the container 10 are configured to permit installation of one or more purge fluid conditioning elements 42 (visible in FIGS. 4-6) in the interior space 24 by inserting the purge fluid conditioning elements 42 from outside the container 10. This eliminates the need for human access and entry into the interior space 24 of the container 10 to install the purge fluid conditioning elements 42, thereby eliminating such entry as a possible source of human contamination of the interior environment. In another embodiment, one or more purge fluid conditioning element(s) can be installed through purge port(s) in the top wall 18. The purge fluid conditioning element(s) installed through the top wall 18 can have the same construction as the purge fluid conditioning element(s) 42 installed through the bottom wall 20 or the purge fluid conditioning element(s) installed through the top wall 18 can have a different construction from the purge fluid conditioning element(s) 42 installed through the bottom wall 20.

In particular, referring to FIGS. 1 and 3, the purge ports 40 of the container 10 are located at the rear of the container 10 outside or beyond the outer perimeter edge of the substrate(s) 26 and positioned on either side of a central portion 44 of the rear wall 22. However, the ports 40 can have any location that permits installation of the purge fluid conditioning element(s) from outside the container 10 via the port 40 formed in any one of the walls, for example the bottom wall 20 or the top wall 18, of the container 10.

The purge fluid conditioning elements 42 can be any type of elements that are insertable into the interior space of the container for use in conditioning the environment in the interior space. Examples of the purge fluid conditioning elements 42 include, but are not limited to, a diffuser, a getter, a filter, combinations thereof, and others. Examples of purge fluid conditioning elements are disclosed in U.S. Pat. Nos. 9,054,144 and 10,347,517.

Figure 4:
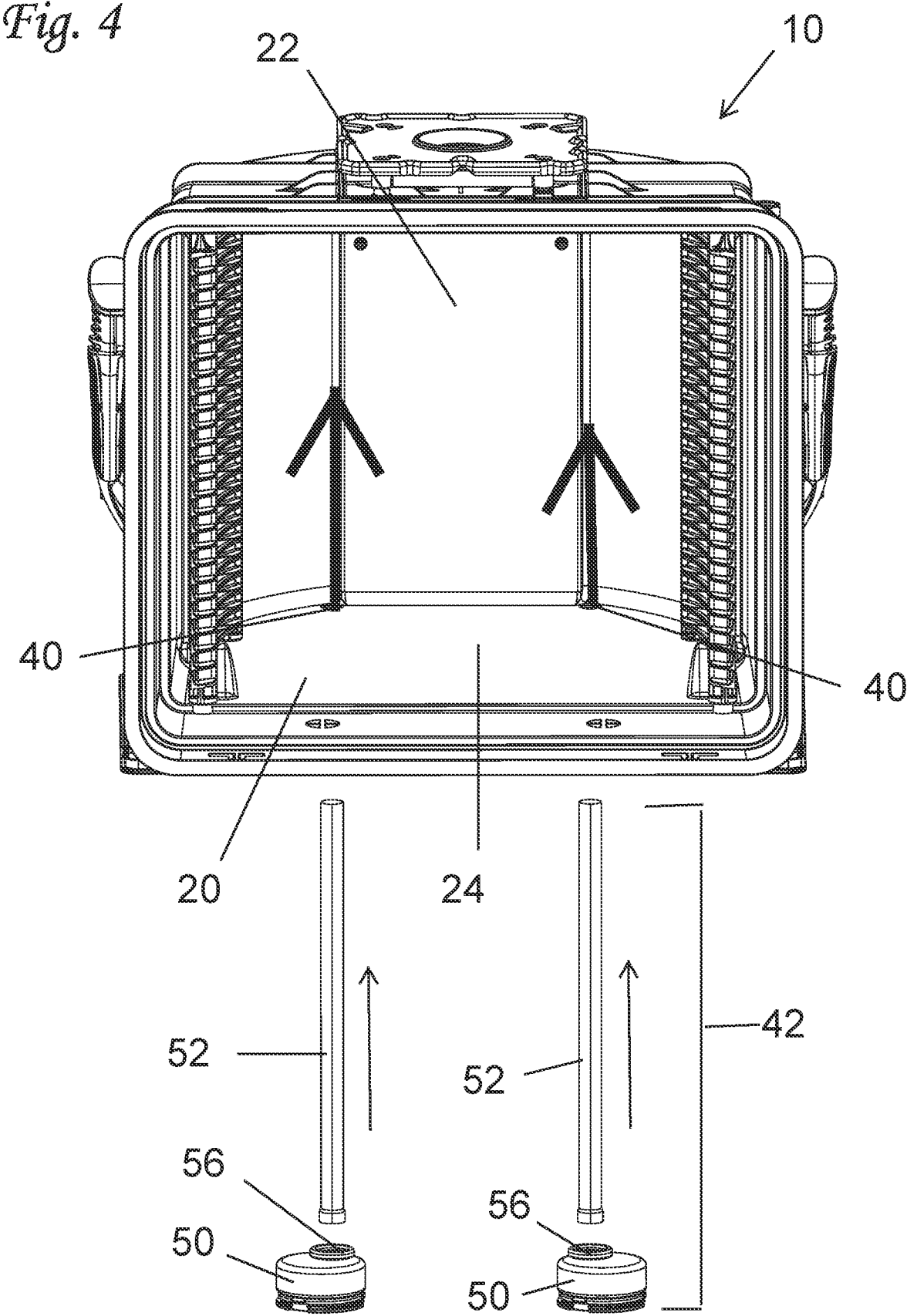
FIG. 4 is a view similar to FIG. 1 showing the beginning of installation of purge fluid conditioning elements into the container.
Figure 5:
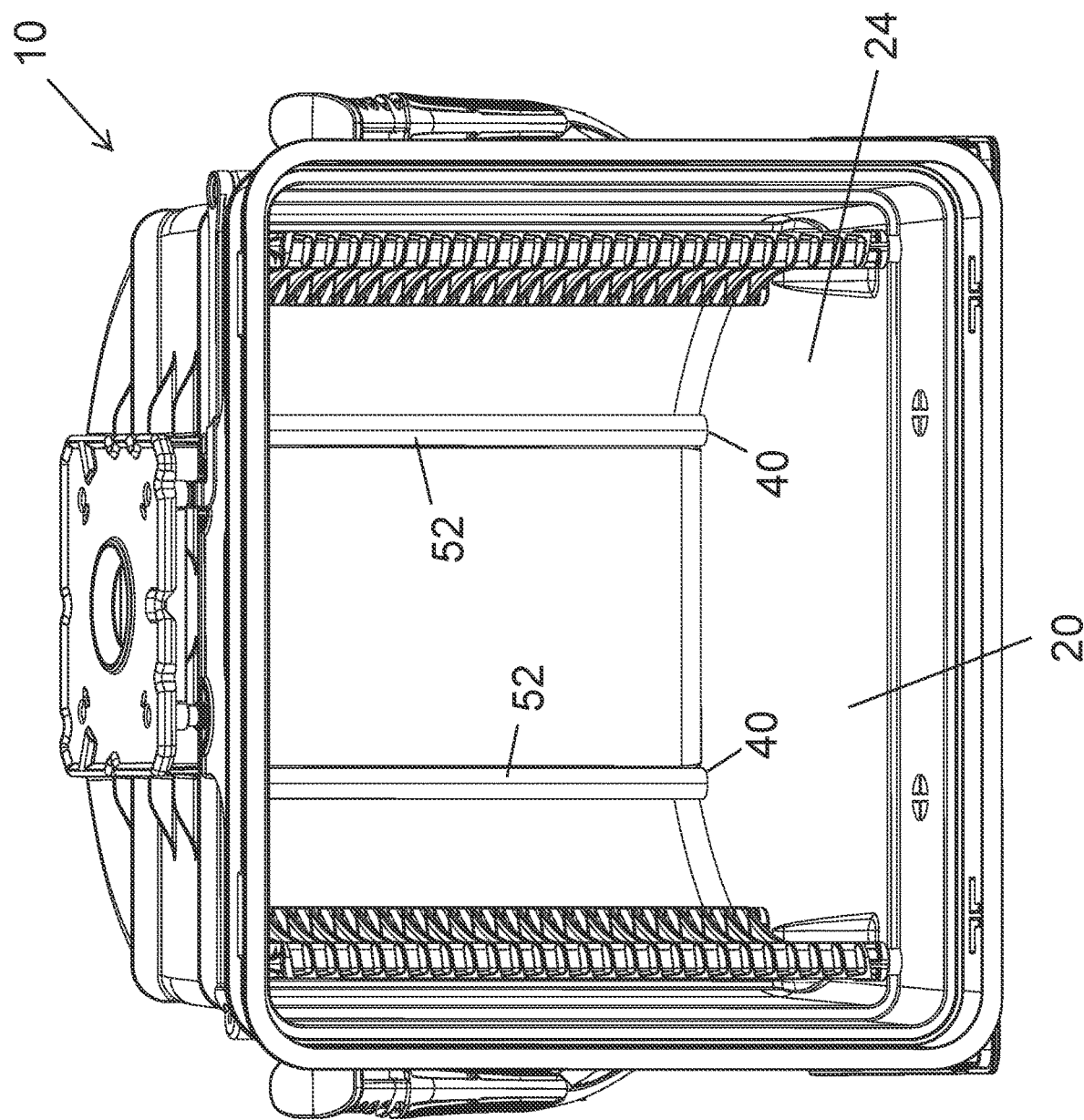
FIG. 5 depicts an example of purge fluid conditioning elements that have been installed in the semiconductor substrate carrying container of FIG. 1 from outside the container via the purge ports.
Figure 6:
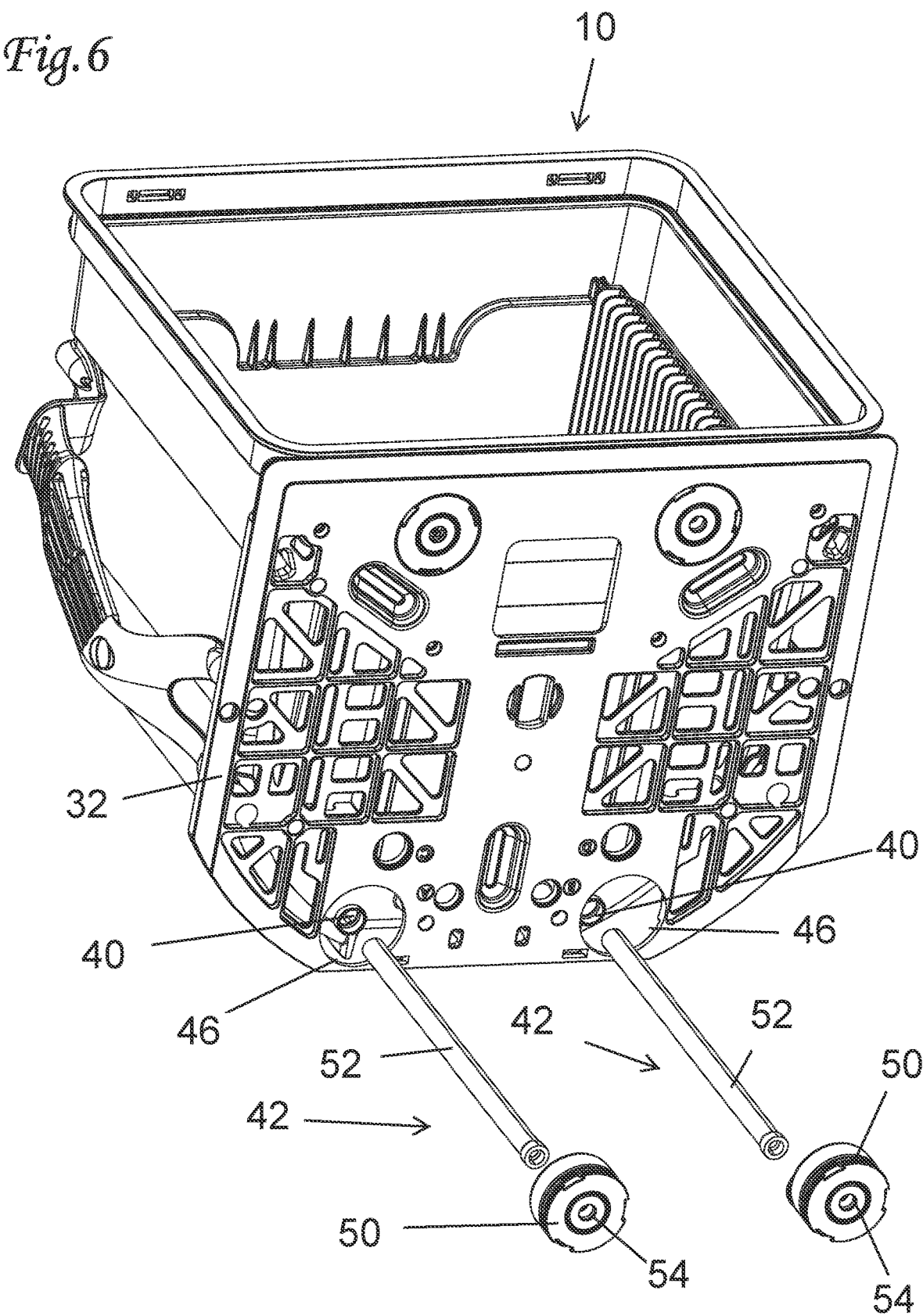
FIG. 6 is a bottom perspective view of the semiconductor substrate carrying container of FIG. 1 depicting installation of the purge fluid conditioning element through the bottom wall.
Figure 7:
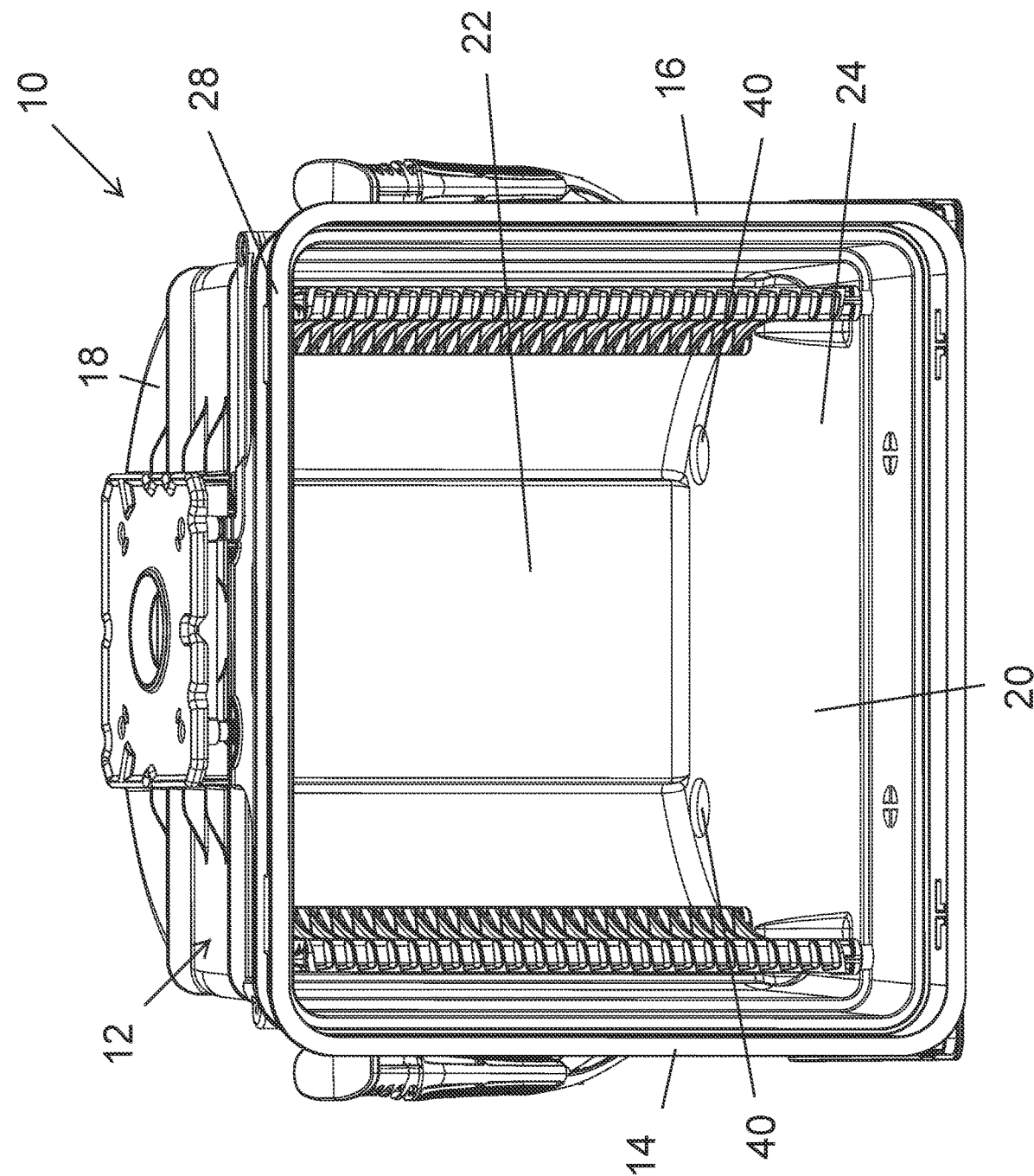
FIG. 7 is a front perspective view of another embodiment of a semiconductor substrate carrying container.

In the example illustrated in FIGS. 4-6, the purge fluid conditioning elements 42 includes a base portion 50 (or mount) and a conditioning portion 52 (or tower) that is attached to the base portion 50 and that extends into the interior space 24 when properly installed. The base portion 50 removably mounts the elements 42 on the substrate container 10 with the conditioning portion 52 extending upwardly through the purge ports 40 and into the interior space of the substrate container 10. The base portion 50 is sized to removably fit within the opening 46 to removably fix the purge fluid conditioning element 42 to the container 10, and the conditioning portion 52 is sized to extend through the purge port 40 into the interior space of the container 10. FIGS. 4-6 depict the base portion 50 and the conditioning portion 52 as being separable from one another. This permits removal and replacement of the conditioning portion 52.

The ports 40 and the openings 46 are depicted as being circular. The openings 46 have a diameter that is greater than the diameter of the ports 40. The conditioning portion 52 has a diameter that is approximately equal to the diameter of the port 40 to allow the conditioning portion 52 to extend upwardly through the purge port 40 and into the interior space of the substrate container 10. The base portion 50 has a diameter that is approximately equal to the diameter of the opening 46 to allow the base portion 50 to fit into the opening 46 for securing the base portion 50 and the element 42 to the container 10. The base portion 50 may connect to the plate 32 and the opening 46 via any suitable type of mechanical or other connection.

As best seen in FIGS. 4 and 6, the base portion 50 is depicted as having a fluid port 54 in the base thereof that is in fluid communication with a fluid port 56 in the top thereof. The ports 54, 56 permit fluid flow through the base portion 50 to direct flow into or from the interior space of the container 10 via the conditioning portion 52. In the illustrated example, the axis of the port 54 is positioned generally centrally on the base portion 50, while the axis of the port 56 is offset from the center of the base portion 50 and therefore offset from the axis of the port 54. The conditioning portion 52 removably attaches to the port 56 in a fluid tight manner.

As best seen in FIG. 5, in this embodiment no portion of the base portion 50 is exposed to the interior space 24 of the container 10. Rather, the purge ports 40 are sized so that only the conditioning portions 52 extend into the purge ports 40 and project above the interior surface of the bottom wall 20.

Referring to FIGS. 4 and 5, an example of installing the purge fluid conditioning elements 42 will be described. Referring initially to FIG. 4, assuming that the purge ports 40 are empty, the fluid conditioning elements 52 are secured to the base portions 50, and the purge fluid conditioning elements 42 are brought into position under the bottom wall 20 allowing the conditioning portions 52 to be inserted through the purge ports 40 in the bottom wall 20 in the direction of the arrows and allow the base portion 50 to be inserted into the openings 46. Because the ports 40 are located outside the perimeter edge of the substrate(s) 26, the purge fluid conditioning elements 42 can be installed through the ports 40 while the substrate(s) 26 is present without the fluid conditioning element 52 contacting the substrate(s) 26.

With reference to FIGS. 5 and 6, when each element 42 is fully installed, the base portion 50 is disposed in the opening 46 removably attaching the element 42 in position, with the conditioning portion 52 extending upwardly through the purge port 40 and into the interior space 24. In one embodiment, when the elements 42 are configured as diffusers, once the elements 42 are installed, a purge fluid can be directed into the elements 42 which distribute the purge fluid into the interior space 24.

In one embodiment, no portion of the conditioning portion 52 (shown in FIGS. 4-6) projects beyond the perimeter edge of the base portion 50. In addition, no portion of the purge fluid conditioning element 42, including the base portion 50 and the conditioning portion 52, contacts the semiconductor substrate upon installing the conditioning portion 52 through the purge port 40 or during use of the container 10. In another embodiment, some portion of the conditioning portion 52 may project beyond the perimeter edge of the base portion 50 as long as the conditioning portion 52 can still be installed through the purge port 40 from the exterior of the container 10 without contacting the semiconductor substrate.

FIGS. 7-10 depict another embodiment of the semiconductor substrate carrying container 10 and installing the purge fluid conditioning elements 42 from outside the container 10. Elements in this embodiment that are similar or identical to elements in FIGS. 1-6 are referenced using the same reference numerals. The embodiment in FIGS. 7-10 differs from the embodiment in FIGS. 1-6 in the construction of the fluid conditioning elements 42 and the purge ports 40.

Figure 8:
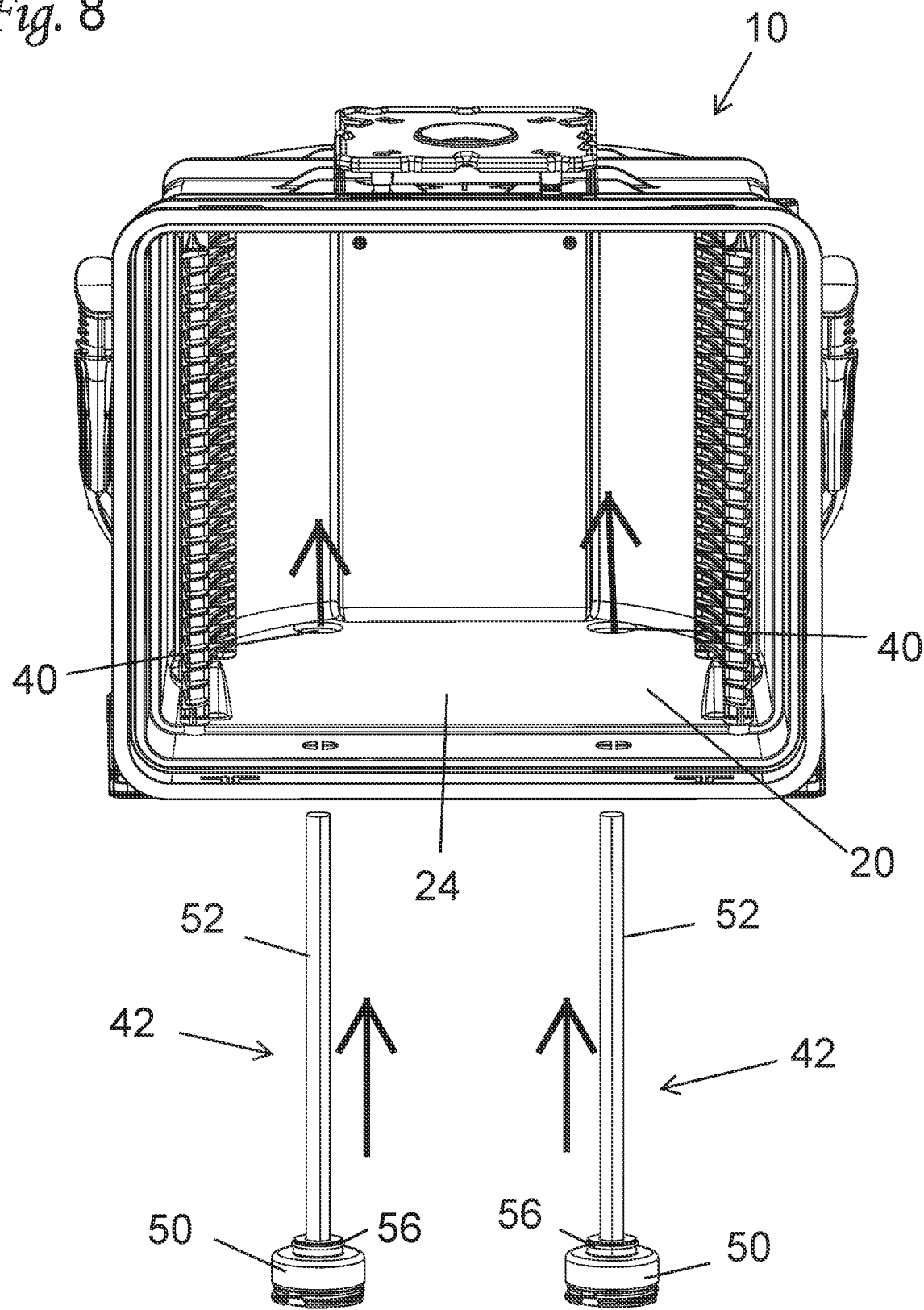
FIG. 8 is a view similar to FIG. 7 showing the beginning of installation of purge fluid conditioning elements into the container.
Figure 9:
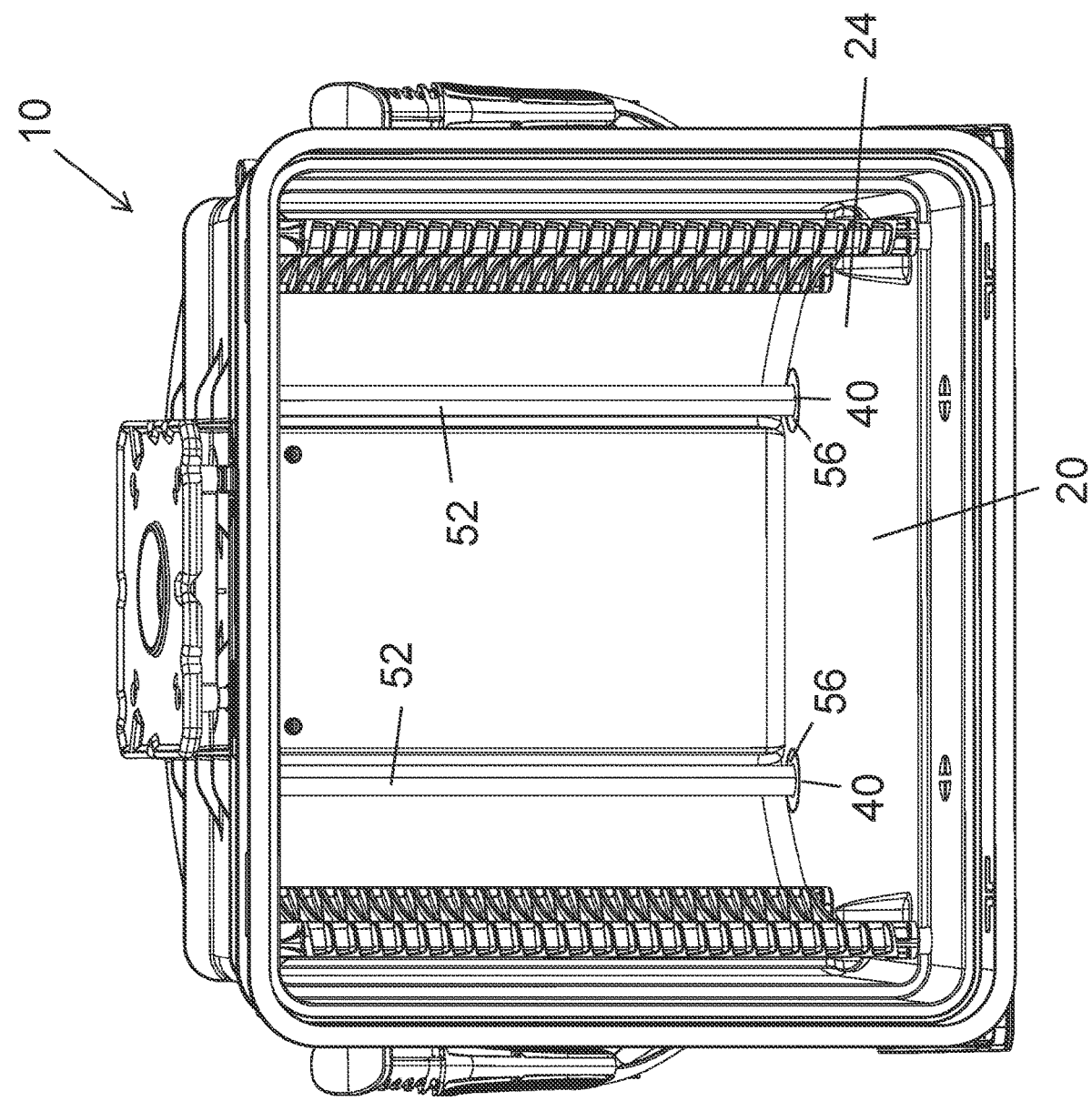
FIG. 9 depicts an example of purge fluid conditioning elements that have been installed in the semiconductor substrate carrying container of FIG. 7 from outside the container via the purge ports.
Figure 10:
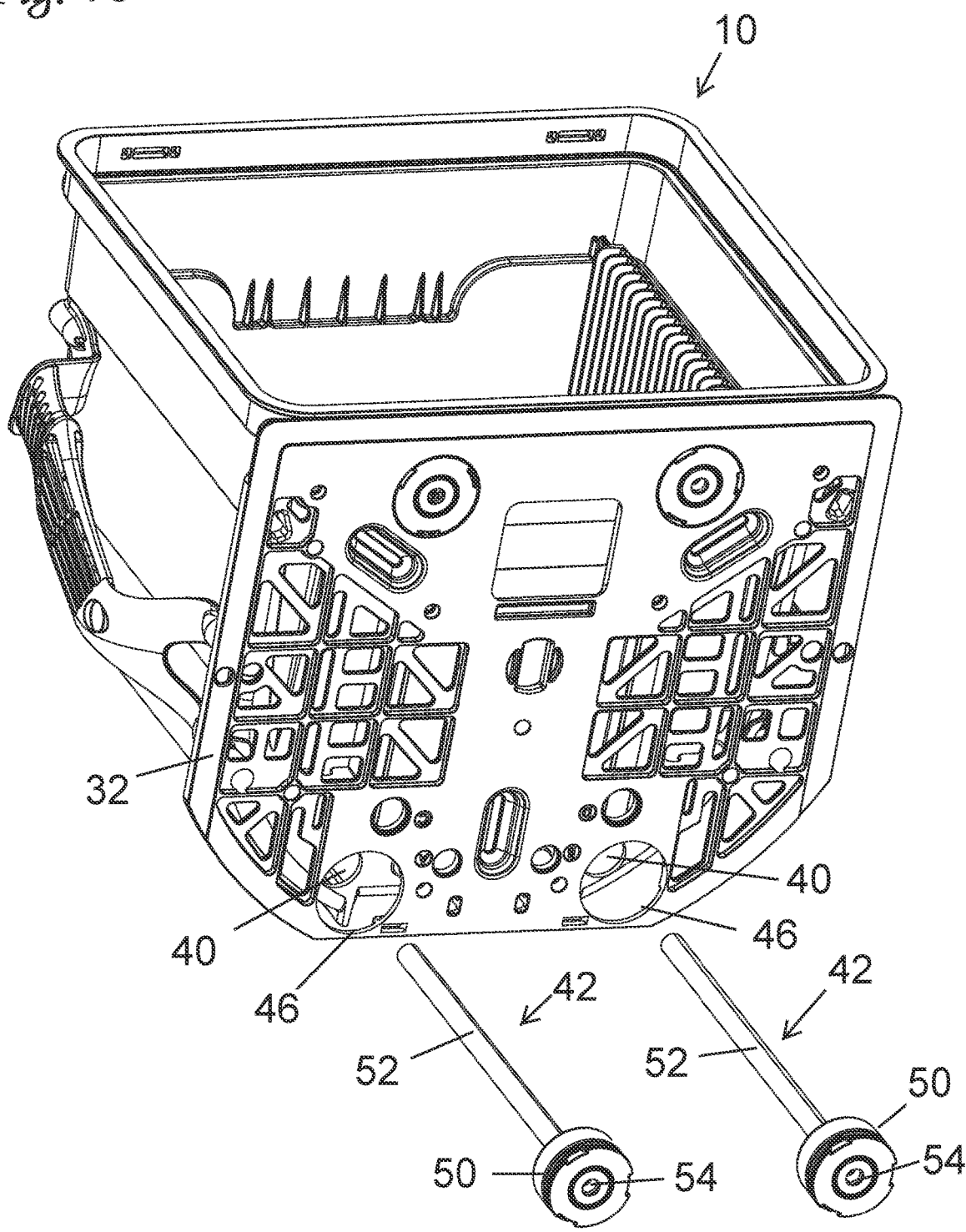
FIG. 10 is a bottom perspective view of the semiconductor substrate carrying container of FIG. 7 depicting installation of the purge fluid conditioning element through the bottom wall.

Referring to FIGS. 8 and 10, the base portion 50 and the conditioning portion 52 are integral with each other (i.e. the conditioning portion 52 is not intended to be removable from the base portion 50 whereby replacement of the conditioning portion 52 also requires replacement of the base portion 50). In addition, in this embodiment, the fluid port 56 is centered on the base portion 50 so that the axes of the ports 54, 56 are coaxial with one another. Further, the diameter of the purge ports 40 in this embodiment is larger than the diameter of the purge ports 40 in FIGS. 1-6 to be able to receive the fluid port 56 therein as best seen in FIG. 9.

An example of installing the purge fluid conditioning elements 42 of FIGS. 7-10 will be described. Referring initially to FIGS. 8 and 10, assuming that the purge ports 40 are empty, the purge fluid conditioning elements 42 are brought into position under the bottom wall 20 and the conditioning portions 52 are inserted through the purge ports 40 in the bottom wall 20 in the direction of the arrows and the base portion 50 is inserted into the openings 46. With reference to FIG. 9, when each element 42 is fully installed, the base portion 50 is disposed in the opening 46 removably attaching the element 42 in position, with the fluid port 56 of the base portion 50 disposed in the purge port 40 and the conditioning portion 52 extending upwardly through the purge port 40 and into the interior space 24. In one embodiment, when the elements 42 are configured as diffusers, once the elements 42 are installed, a purge fluid can be directed into the elements 42 which distribute the purge fluid into the interior space 24. Although the purge ports in FIGS. 7-10 are larger than in the embodiment in FIGS. 1-6, the purge fluid conditioning elements 42 can still be installed through the purge ports 40 without the conditioning portions 52 contacting any substrate(s) that are contained in the container 10.

The conditioning portions 52 of the purge fluid conditioning element(s) 42 of FIGS. 1-6 and 7-10 may be installed into the interior space of the semiconductor substrate carrying container from outside the semiconductor substrate carrying container and through the purge port 40 formed in one of the walls, such as the bottom wall 20. In another embodiment, the conditioning portion 52 of the purge fluid conditioning element(s) 42 can be installed into the interior space of the semiconductor substrate carrying container while at least one semiconductor substrate 26 is present in the interior space, or while no semiconductor substrates 26 are present in the interior space. The purge fluid conditioning element(s) 42 can be manually installed, mechanically installed using a mechanical device that holds the purge fluid conditioning element(s) 42 during installation, or by a combination of manual installation and mechanical installation.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:
1. A method comprising installing a purge fluid conditioning element having a base portion and a conditioning portion into an interior space of a semiconductor substrate carrying container that includes a plurality of walls that define the interior space and that has an opening that is sized to permit a semiconductor substrate to be inserted into and removed from the interior space, wherein installing the purge fluid conditioning element comprises installing the purge fluid conditioning element from outside the semiconductor substrate carrying container and through a port formed in one of the walls.

2. The method of claim 1, wherein the plurality of walls includes a bottom wall and the port is formed in the bottom wall whereby the purge fluid conditioning element is installed from outside the semiconductor substrate carrying container through the port formed in the bottom wall.

3. The method of claim 1, wherein the semiconductor substrate carrying container comprises a front opening unified pod.

4. The method of claim 1, wherein the purge fluid conditioning element comprises a diffuser, a getter, or a filter.

5. The method of claim 1, comprising installing the purge fluid conditioning element into the interior space without a semiconductor substrate being present in the interior space.

6. The method of claim 1, comprising installing the purge fluid conditioning element into the interior space while at least one semiconductor substrate is present in the interior space.

7. The method of claim 1, wherein the semiconductor substrate comprises a wafer or a flat panel, and the interior space of the semiconductor substrate carrying container is sized to receive a plurality of the wafers or flat panels therein.

8. A method comprising installing a purge fluid conditioning element having a base portion and a conditioning portion into an interior space of a semiconductor substrate carrying container by inserting the purge fluid conditioning element through a purge port formed in a bottom wall of a shell of the semiconductor substrate carrying container from outside the semiconductor substrate carrying container.

9. The method of claim 8, wherein the interior space of the semiconductor substrate carrying container is sized to receive a plurality of wafers or flat panels therein.

10. The method of claim 8, wherein the semiconductor substrate carrying container comprises a front opening unified pod.

11. The method of claim 8, wherein the purge fluid conditioning element comprises a diffuser, a getter, or a filter.

12. The method of claim 8, comprising installing the purge fluid conditioning element into the interior space without a semiconductor substrate being present in the interior space.

13. The method of claim 8, comprising installing the purge fluid conditioning element into the interior space while at least one semiconductor substrate is present in the interior space.

14. A method comprising installing a purge fluid conditioning element having a base portion and a conditioning portion into an interior space of a semiconductor substrate carrying container while at least one semiconductor substrate is present in the interior space.

15. The method of claim 14, comprising installing the purge fluid conditioning element from outside the semiconductor substrate carrying container through a port formed in a wall of the semiconductor substrate carrying container.

16. The method of claim 15, wherein the wall comprises a bottom wall.

17. The method of claim 14, wherein the semiconductor substrate carrying container comprises a front opening unified pod.

18. The method of claim 14, wherein the purge fluid conditioning element comprises a diffuser, a getter, or a filter.

19. The method of claim 14, comprising installing the purge fluid conditioning element into the interior space of the semiconductor substrate carrying container while a plurality of the semiconductor substrates are present in the interior space.

* * * * *